US005758405A

United States Patent [19]

[11] Patent Number: 5,758,405
[45] Date of Patent: Jun. 2, 1998

Bent et al.

[54] CONSUMABLE MANDREL FOR SUPERCONDUCTING MAGNETIC COILS

[75] Inventors: Bruce R. Bent, Scituate; Craig John Christopherson, South Grafton; Eric R. Podtburg, Natick; Derek Patrick Daly, Sharon, all of Mass.

[73] Assignee: American Superconductor Corporation, Westborough, Mass.

[21] Appl. No.: 431,705

[22] Filed: Apr. 28, 1995

[51] Int. Cl.$^6$ .......... H01L 39/24
[52] U.S. Cl. .......... 29/599
[58] Field of Search .......... 336/DIG. 1; 29/599; 505/230, 232, 236, 500, 510

[56] References Cited

U.S. PATENT DOCUMENTS 4,154,141 5/1979 Sayles .......... 86/1 R
4,554,731 11/1985 Borden .......... 29/605
4,617,789 10/1986 Borden .......... 29/599
4,646,044 2/1987 Kuno et al. .......... 335/299
4,863,660 9/1989 Cahuzac et al. .
4,917,756 4/1990 Cahuzac et al. .
4,983,228 1/1991 Taub .......... 148/133
5,138,326 8/1992 Edwards et al. .
5,531,015 7/1996 Manlief et al. .......... 29/599

*Primary Examiner*—Matthew V. Nguyen
*Attorney, Agent, or Firm*—Fish & Richardson P.C.

[57] ABSTRACT

The invention relates to a processing method for fabricating a superconducting magnetic coil using a mandrel having a consumable component. When exposed to a final processing step, the consumable component is mechanically weakened through oxidation or thermal decomposition. The mandrel can then be easily removed from the coil without straining the conductor, thus preserving the coil's electrical and mechanical properties.

30 Claims, 2 Drawing Sheets

CONSUMABLE MANDREL FOR SUPERCONDUCTING MAGNETIC COILS

BACKGROUND

This invention relates generally to superconducting magnetic coils and methods for manufacturing them.

Superconducting magnetic coils are typically fabricated using the react-and-wind process. In this method, metallurgical techniques are used to form a wire or tape containing a "precursor" to the eventual superconducting material (Sandhage et al., "Critical Issues in the OPIT Processing of High-$I_c$ BSCCO Superconductors", Journal of Metals Mar. 21, 1991). The precursor is then processed in a high-temperature, oxidizing environment to form a composite conductor typically consisting of a ceramic oxide superconducting material encased in a metallic, matrix-forming material (see, for example, Riley et al., "Improved Processing for Oxide Superconductors", U.S. Ser. No. 08/041822, U.S. Patent Pending, the contents of which are incorporated herein by reference). The composite conductor is then insulated and wound around a mandrel to form the coil, which may be processed with a final heat-treating step to optimize the conductor's electrical properties.

Alternatively, a wind-and-react method can be used to fabricate superconducting magnetic coils. Here, the precursor to the composite conductor is wound around the mandrel prior to a final processing step. Exposure of the entire coil to a high-temperature, oxidizing environment results in the reaction of the precursor material, facilitating its conversion to a superconducting material. The wind-and-react processing method has been previously described in detail in Manlief et al., "Superconducting Wind-and-React Coils and Methods of Manufacture", U.S. Ser. No. 08/188220, U.S. Patent pending, the contents of which are incorporated herein by reference.

In both the react-and-wind and wind-and-react processing methods, it is preferable to minimize the total strain imparted on the superconducting material during processing and operation. This is especially important for high-temperature superconductors, where small "micro-cracks" may form when the material is strained, resulting in a sharp decrease in the superconductor's electrical properties.

In addition, the mandrel supporting the superconducting wire or tape may contribute to the mechanical straining of the conductor. For example, when cooled to the cryogenic temperatures necessary to operate most coils, thermal expansion and contraction of the mandrel may strain the conductor over time. Moreover, the mandrel performs no electrical or mechanical function once the coil is heat treated and potted, and is often difficult to adapt into particular device configurations in which the coil is mounted and used. In addition, materials used in the mandrel may be susceptible to magnetic fields or have magnetic properties, and may distort the coil's resultant field.

It can therefore be desirable to remove the mandrel following heat treatment or potting. This is particularly difficult in tightly wound coils containing high-temperature superconductors, as adherence between the inner layer of conductor and the outer surface of the mandrel may make it difficult to remove the mandrel from the coil without causing damage. Perhaps more importantly, horizontal, vertical, or angular strains imparted on the high-temperature superconductor during mandrel removal can bend the conductor along a direction perpendicular to its length. This type of strain, classified as a "hard bend", may result in a fracturing of the superconducting platelets or an increase in the grain boundaries along the strain, and may therefore decrease the current-carrying capacity of the superconducting wire or tape.

SUMMARY

Accordingly, a feature of the invention is a process for producing a superconducting magnetic coil wherein the mandrel is removed without affecting the electrical properties of the coil. This is accomplished using a mandrel which includes a consumable component. Most preferably, this component is oxidized during a heat-treating step involving processing the coil in a high-temperature, oxidizing environment, such as in the wind-and-react method. The consumable material is carefully chosen to be inert relative to other materials in the coil. Most preferably, the consumable material is oxidized during the normal heat-treating schedule used to process high-temperature superconductor precursor materials.

In general, in one aspect, the invention relates to a method for producing a superconducting magnetic coil which includes the step of fabricating a length of tape containing a superconducting material or a precursor to a superconducting material. The method features winding a length of tape around a mandrel which includes a consumable component in order to form a coil, with the inner-most layer of tape being in contact with the outer surface of the consumable component. After the winding step, the coil is heat treated by exposure to high temperatures in an oxygen-containing environment. This results in mechanically weakening portions of the consumable component of the mandrel so that the mandrel may be removed from the coil without significantly affecting the coil's electro-mechanical properties. "Tape", as used herein, is meant to include any elongated structure which may contain the superconducting material or precursor thereto. For example, elongated structures having rectangular, circular, hexagonal, or any other cross-sectional shapes are considered to be "tapes".

Preferably, the consumable component of the mandrel is oxidized or thermally decomposed during the heat treating step normally used to process the superconducting m aterial or precursor thereto, and no additional steps are added to the process. "Oxidized", as used herein, is meant to include any process by which any oxide of the consumable material may be formed.

In preferred embodiments, the consumable component is oxidized during a heat treating schedule which includes the steps of heating and cooling the coil in the oxygen-containing environment. Preferably, the heat treatment involves heating the coil when the oxygen pressure is between $1\times10^{-5}$ and 300 atm and the temperature is between 400° C. and 900° C.; allowing the coil to be processed for a time period sufficient to allow reaction of portions of the consumable component; and, finally, cooling the coil to room temperature. This heat treating process can be used, for example, to process wind-and-react coils containing precursors to bismuth strontium calcium cuprate (BSCCO) or yttrium barium cuprate (YBCO) high-temperature superconductors.

When the tape contains a precursor to a superconducting material (that is, wind-and-react processing), the heat treating step used to decompose the consumable component further results in conversion of the precursor to the desired superconducting material. In this embodiment, the step of heat treating preferably includes the steps of heating the coil at a rate of about 1°–10° C./min. to a temperature between 400° C. and 815° C.; heating the coil at a rate of about 1°–10° C./min. until a maximum temperature of between 815° C. and 835° C. is obtained; heating the coil at the maximum temperature for a time period between 0.1 and 100 hours; cooling the coil at a rate of about 1–10° C./min. until a temperature of between 795° C. and 815° C. is obtained; holding the coil at this temperature for a time period in the range of 1 to 300 hours; cooling the coil at a rate of about 1°–10° C./min. until a temperature of between 735° C. and 795° C. is obtained; holding the coil at this temperature for a time period in the range of 1 to 100 hours; cooling the coil at a rate of about 1°–10° C./min. until a temperature of about 20° C. is obtained, with the heat treating step being performed when the oxygen pressure is between about $1\times10^{-5}$ and 300 atm.

In another preferred embodiment, the step of heat treating includes heating the coil at a rate of about 1°–10° C./min. until a temperature of between 300° C. and 600° C. is obtained; heating the coil at this temperature for a time period of between 100 and 800 hours; heating the coil at a rate of about 1°–10° C./min. until a maximum temperature of between 700° C. and 900° C. is obtained; heating the coil at the maximum temperature for a time period of 1 and 200 hours; and, cooling the coil at a rate of about 1°–10° C./min. until a temperature of 20° C. is obtained. The heat treating step is performed in the environment comprising oxygen, wherein the pressure of the oxygen is between $1\times10^{-5}$ and 300 atm.

Alternatively, the tape can include a superconducting material (that is, react-and-wind processing). In this case, the step of heat treating includes the steps of heating the coil in an oxygen-containing environment to a temperature which allows at least partial oxidation of the consumable material without degrading the properties of the superconducting material. In other embodiments, the coil is heated at a temperature of between 300° C. and 900° C. to thermally decompose portions of the mandrel's consumable component.

In another aspect, the invention relates to a mandrel for supporting the winding of a superconducting magnetic coil during the winding phase of coil manufacture. The mandrel includes a base portion and a core portion, with the core portion including a consumable component composed of a material, preferably a metal, which reacts (e.g., oxidizes, decomposes) when exposed to high temperatures in an oxidizing environment. Most preferably, the consumable material is completely oxidized during the heat treatment, and is selected from the group including niobium, molybdenum, tungsten, vanadium and tantalum. Other preferred materials include hafnium, zirconium, yttrium, and the rare earth metals. Still other metals which can be used include iron, chromium, cobalt, nickel, titanium, and copper.

Other materials which undergo thermal decomposition when exposed to high temperatures can also be used as the consumable component of the mandrel. These materials include cellulose-based materials, such as paper and wood, or plastics.

In particularly preferred embodiments, the mandrel's consumable component is constructed to partially surround a mandrel core, with the inner and outer surfaces of the component adapted to contact or be in close proximity to portions of both the mandrel and the inner-most portion of the coil. In this case, the consumable component of the mandrel results in the separation of the mandrel and the inner-most portion of the coil. Alternatively, the consumable component is shaped as a sleeve adapted to partially surround (e.g., wrap around) the mandrel. In another embodiment, the consumable component of the mandrel is composed of multiple consumable portions, such as a series of strips, each adapted to cover a portion of the mandrel. In other embodiments, the mandrel consists entirely of a consumable material. In this embodiment, the mandrel can have an arbitrary cross-sectional shape, with circular or elliptical "racetrack"-shaped cross sections being preferred.

In yet another aspect, the invention provides a superconducting magnetic coil produced by fabricating a length of tape including a superconducting material or a precursor to a superconducting material, and then winding the tape around a mandrel including a consumable component. The coil is then heat treated in a high-temperature oxygen-containing environment, resulting in the mechanical weakening of portions of the mandrel's consumable component. This allows the mandrel to be removed from the coil without significantly affecting the coil's electro-mechanical properties. The coil may include a high-temperature superconducting material selected from the oxide superconducting family.

The inventions have many advantages. In particular, the consumable mandrel can be reacted using normal, well-established processing methods used to process high-temperature superconducting materials. Once the consumable material is oxidized or decomposed during the final processing step, the mandrel can be easily removed from the coil without affecting the superconducting portion. This minimizes any strain imparted on the superconducting material during the removal process, and allows the electrical properties of the coil to be maintained at a high level. This is often not the case with conventional coils, especially those containing high-temperature superconductors, as following processing, the non-decomposed mandrel may be in direct contact with the superconducting tape, and may strain the material when removed.

DETAILED DESCRIPTION

Figure 1:
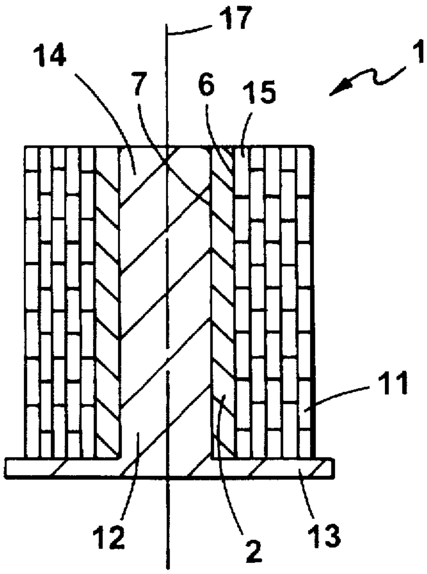
FIG. 1 is a cross-sectional view of a superconducting magnetic coil featuring a mandrel containing a consumable component according to the invention.

Referring first to FIG. 1, a superconducting coil 1 manufactured according to the method of the present invention features a mandrel 12 including a consumable component 2 which separates an upper portion 14 (i.e., the mandrel core) of the mandrel 12 from the first layer 15 of a wound tape 11. Preferably, the outer 6 and inner 7 surfaces of the mandrel's consumable component 2 are in contact with, respectively, the first layer 15 of the coil winding and an outer surface of the upper portion 14 of the mandrel. Alternatively, a thin layer of an interstitial material may be used to separate the consumable component from the first layer 15 of the coil winding. In the illustrated embodiment, the tape 11 has a rectangular cross section in order to maximize winding density. In alternate embodiments, a tape having an elliptical, hexagonal, circular, square, or any other cross-sectional geometry may be used.

The consumable component of the mandrel is designed to oxidize and mechanically weaken during heat treating of the coil, thereby facilitating easy removal of the mandrel while leaving the electrical properties of the superconductor intact. Most preferably, during heat treatment, the consumable material is oxidized at a temperature below that needed to process the superconducting material or precursor. For example, complete oxidation preferably occurs as the temperature is ramped to the level required to process the superconductor precursor (that is, about 800° C.). In this way, following heat treating, the consumable component is weakened to the point where it is essentially left without mechanical strength. If severely oxidized, for example, the consumable component may degrade to a powder-like composition which can be easily removed from the coil in a piecewise manner.

Figure 2A:
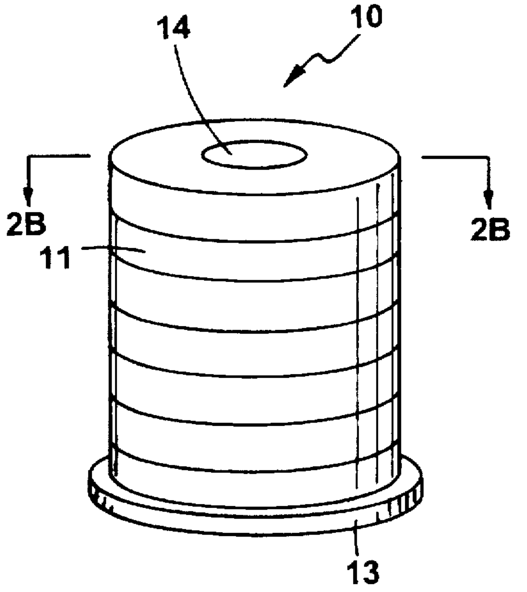
FIG. 2A is a plan view of a conventional superconducting magnetic coil including a permanent mandrel.
Figure 2B:
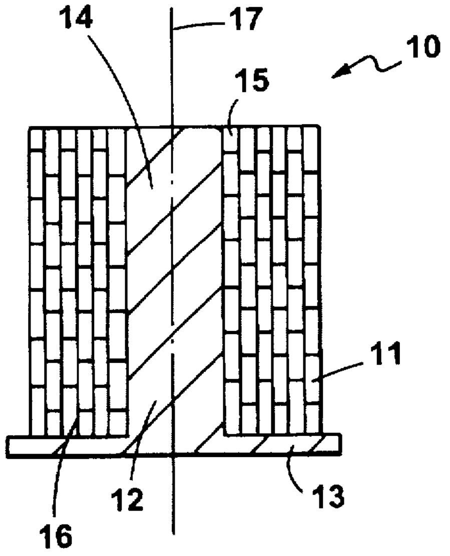
FIG. 2B is a cross-sectional view of the conventional superconducting magnetic coil along line 2B—2B in FIG. 2A.

In contrast, mandrels which are not oxidized or otherwise weakened during heat treatment may adversely affect the electrical properties of the conductor when removed. For example, FIGS. 2A and 2B show a superconducting magnetic coil 10 of the prior art which includes a conducting material 11 wound around a mandrel 12 containing a base portion 13 forming the base of the superconducting magnetic coil 10, and an upper portion 14 for supporting the conducting material 11 during coil winding. The conducting material 11 is wound in a helical fashion so that a first layer 15 completely covers and is in direct contact with the outer surface of the upper portion 14 of the mandrel. Multiple layers 16 of conducting material 11 are wound on top of the first layer 15 to form a layer-wound solenoid coil. After processing, it may be difficult or impossible to remove the mandrel without adversely affecting the conductor's electrical or mechanical properties.

Preferably, the materials used for the consumable component rapidly convert to any of their associated oxides or thermally decompose when exposed to high temperatures alone, or high temperatures in an oxidizing environment. Melting of the consumable component during heat treating is not desirable, as this may lead to a flow of material across the mandrel/coil boundary and into the inner windings of the coil. This may adversely affect the conductor's electrical and mechanical properties or inhibit formation of the high-temperature superconducting phase. Moreover, the entire mandrel, including the consumable component, is preferably composed of materials which have no solid solubility with respect to the matrix-forming material (e.g., silver) and the superconducting material. In particular, materials which are soluble in silver may form alloys in close proximity to the superconducting precursor material, thereby affecting the conversion of the precursor to the superconducting state. In addition, prior to processing, the consumable component of the mandrel must have adequate mechanical strength to support the superconducting tape (or its precursor) during coil winding.

Most preferably, the consumable mandrel is used in wind-and-react applications, and provides support for a precursor to high-temperature superconducting material prior to and during heat treatment. When used in this capacity, the consumable material is most preferably oxidized as the temperature is ramped up to the level required to process the precursor. Thus, during processing when the mandrel, matrix-forming material, and superconductor precursor all compete for oxygen, the consumable component is the first component of the coil to be oxidized. In this way, the consumable component may become completely porous, thereby making it permeable to all gases and allowing other portions of the coil to be exposed to oxygen. This allows adequate oxygen access to the superconductor precursor material, thereby facilitating its conversion to the eventual superconducting material.

For consumable materials which readily form alloys (particularly with the matrix-forming material), it may be necessary during heat treatment to have a "hold time" during which the consumable material is heated below its melting point for a time period to allow substantial oxidization, but not significant alloying, to occur. In this way, the consumable material can weaken without affecting the matrix-forming material or the superconducting precursor. For example, when copper is used as the consumable material, the coil can be heated at about 400° C. for a time period allowing complete oxidation.

As described above, the consumable component of the mandrel is preferably oxidized as the temperature is increased from room temperature to the final processing temperature. Thus, during the cool-down cycle of the heat treating step, the mandrel's consumable components are already oxidized. This obviates the need to adjust cool-down parameters such as the cooling rate and cooling temperature to achieve oxidation or decomposition. Moreover, the oxidized or decomposed consumable components have basically no mechanical affect on the coil during the cool-down cycle.

In general, the heat treating parameters chosen to oxidize the consumable material will depend on the material being used. Information regarding the thermodynamic oxidation of metals is featured in the *ASM Metals Handbook* (Corrosion, Vol. 13, pages 61–76) the contents of which are incorporated herein by reference. Relevant information concerning metal oxidation is also included in Ellingham diagrams, JANAF Tables, and Tables of Oxidation Potentials found in, for example, "The Handbook of Chemistry and Physics-$66^{th}$ Edition", CRC Press (1985), the contents of which are also incorporated herein by reference. It is understood that the temperature, oxygen pressure, and time period required to oxidize any consumable material can be determined from these diagrams and tables.

In a particularly preferred embodiment, the consumable component of the mandrel is composed of a metallic material selected from the group including tantalum niobium, tungsten, vanadium, or molybdenum. When exposed to high-temperature oxidizing conditions, these materials are rapidly converted to their corresponding oxides and have no solid solubility (and are thus unreactive) with silver. Moreover, when oxidized, these materials become porous, thereby allowing oxygen access to superconducting materials in the coil. Complete oxidization occurs during the well-defined heat treating steps used to convert precursor materials to superconducting materials, and thus no new steps need to be added to the heat treating process.

Materials such as hafnium, zirconium, yttrium, and the rare earth metals have high oxidation rates and may also be used as the consumable material. These materials, however, are somewhat reactive with the silver matrix-forming material, and are processed using the separate "hold time" described above to form an oxide coating, or "scale" on their outer surfaces. In this case, the scale forms a barrier which may prevent reaction between the consumable material and the silver matrix-forming material.

Metals which are not completely oxidized, but require no "hold time" may also be used. These materials include iron, titanium, cobalt, and nickel. Copper is relatively easily oxidized using a "hold time" and may also be used. However, this material has a high solubility with silver, and thus may react with the matrix-forming material.

Materials other than metals, such as cellulose-based materials (e.g., paper, plastics, or wood) may also be used to form the mandrel's consumable component to the extent that they do not, during decomposition, deleteriously affect the properties of the superconducting material.

Table 1, below, summarizes the properties of the consumable materials described above.

TABLE 1

| Material | Consumable Materials<br>Hold Time (using wind-and-react processing for BSCCO-type materials | Comments |
|---|---|---|
| tantalum niobium, tungsten, vanadium, molybdenum | no | most preferable; high oxidation rates, no solid solubility with silver |
| hafnium, zirconium, yttrium, the rare earth metals | yes | preferable; high oxidation rates, some solid solubility with silver |
| iron, titanium, cobalt, and nickel | no | less preferable; relatively low oxidation rates |
| copper | yes | less preferable; relatively high oxidation rate, significant solubility with silver |
| cellulose-based materials (e.g., paper, wood) | no | preferable; relatively low mechanical strength |

The consumable component of the mandrel may take on a number of different forms, and may be shaped as a sleeve, a wrapped sleeve, a series of strips, or in any other geometry which can placed around a permanent mandrel core. Alternatively, the entire mandrel may be composed of a consumable material.

Figure 3A:
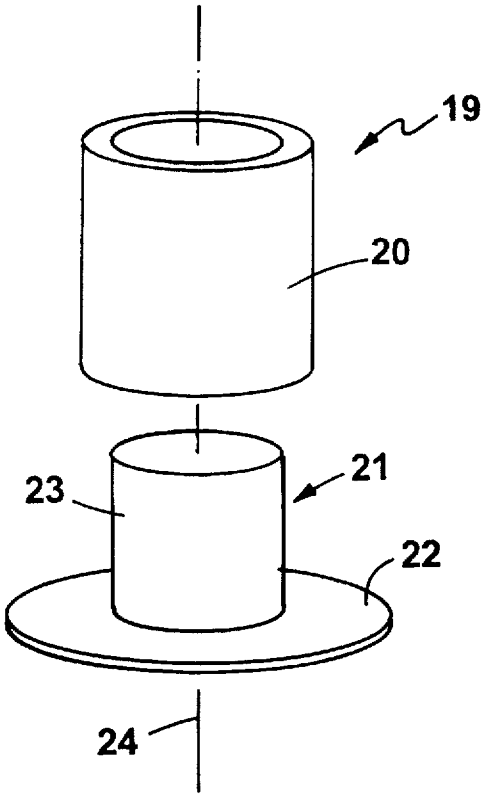
FIGS. 3A and 3B are exploded plan views of a permanent mandrel including, respectively, a consumable sleeve and a consumable wrapped sleeve according to the invention.

Referring now to FIG. 3A, in preferred embodiments, the mandrel 19 contains a consumable sleeve 20 composed of a material which undergoes oxidation or thermal decomposition when exposed to high temperatures in an oxidizing environment. In this case, the consumable sleeve 20 is designed to slip around a permanent mandrel core 21 which is not weakened during the heat treating process. The core 21 contains a base portion 22 and an upper portion 23. Preferably, the core is formed from a solid workpiece. For example, the core may be formed using standard machining techniques. The base portion 22 is preferably fabricated so that a winding flange can be attached thereto, thereby allowing the entire mandrel 19 to be mounted in a lathe or other rotary device to facilitate coil winding around an axis 24. Preferably, the consumable sleeve 20 is constructed to fit tightly around the upper portion 23 of the permanent mandrel so that it is not free to move relative to this component during coil winding.

The physical dimensions of the consumable sleeve are dependent on its material composition and the geometry of the coil. Because it is preferable that the sleeve is completely oxidized during the final heat treatment, its thickness is dependent on the time duration of the processing steps, and the reaction rate of the consumable material. Materials having slow oxidation rates may not be completely weakened during heat treatment unless made sufficiently thin. Typically, the thickness of the consumable sleeve is less than 1.0 cm.

Figure 3B:
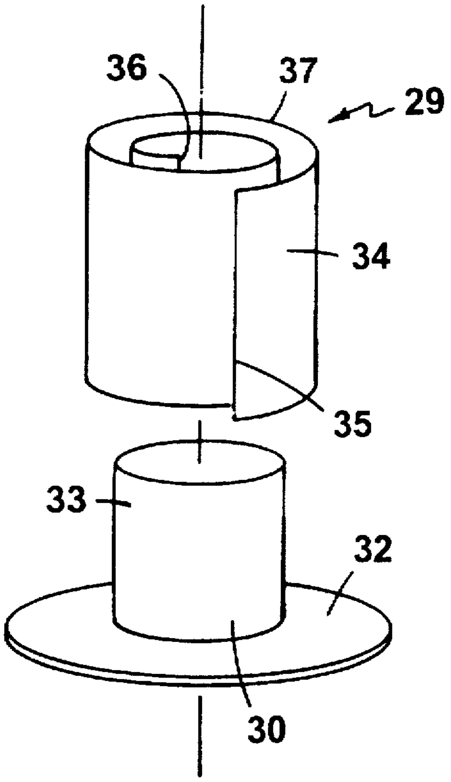

Referring now to FIG. 3B, in another embodiment, a mandrel 29 contains a permanent mandrel core 30 composed of lower 32 and upper 33 portions. Here, the mandrel's consumable component is a wrapped sleeve 34 having unconnected end portions 35, 36 lying, respectively, on the outer and inner edges of the sleeve 34. The sleeve is tightly wrapped around the upper portion 33 of permanent mandrel 30. Control over the collective thickness of the consumable component is achieved by adjusting the number of sleeve layers. This type of wrapped sleeve is particularly preferred for larger coils, which often require the mandrel'consumable component to be sufficiently thick in order to support the conducting material during coil winding. In certain cases, it may be desirable to vary the thickness of the sleeve 34 along its length 37.

Pliable materials, such as a foils or meshes, are preferred for the wrapped sleeve as they can be easily adapted or formed around mandrels having complex geometries. In this case, the consumable wrapped sleeve is often preferred to the consumable sleeve (FIG. 3A) which may be difficult to fabricate in such geometries. When in the form of a porous mesh, the wrapped sleeve has a high surface-to volume ratio, and is thus more easily oxidized by the external environment. Typically, in order to insure flexibility, the sleeve thickness is less than 2.0 mm. For example, a metal foil having a thickness of about 150 μm may be used.

Figure 3C:
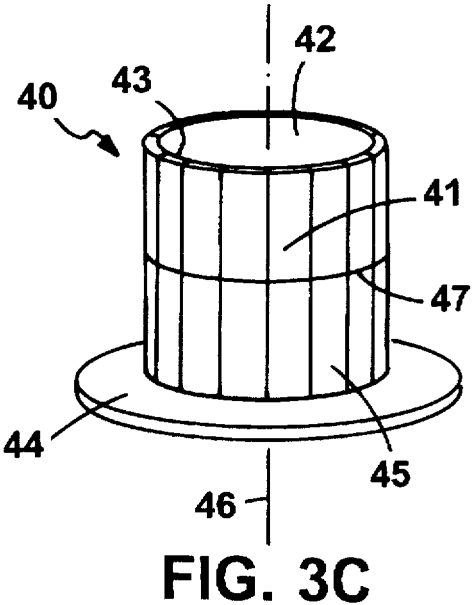
FIGS. 3C and 3D are plan views of, respectively, a permanent mandrel including a series of consumable strips and a solid consumable mandrel according to the invention.

Referring now to FIG. 3C, in another embodiment, a mandrel 40 includes a consumable component 41 featuring a series of strips 45, and a permanent mandrel core 42 including upper 43 and lower 44 portions. The strips 45 extend in a direction parallel to the center axis 46 of the coil, and are preferably disposed in a "barrel stave" configuration to completely surround the upper portion 43 of the permanent mandrel. Preferably, each strip is held in place by a thin wire 47 also fabricated from a consumable material.

The strips 45 are preferably formed from one of the materials described above and have a thickness of between 0.1 and 2.0 mm. In order to vary the thickness of the consumable layer, the strips may be placed around the upper portion of the mandrel in a multi-layer configuration. In other embodiments, the strips may be used in combination with the solid or wrapped sleeve embodiments to form the mandrel's consumable component. In addition, for certain coil geometries, it may be desirable to fabricate a consumable mandrel having a non-uniform thickness. This is easily accomplished with the "barrel stave" embodiment by varying the number of strips placed at different locations around the permanent mandrel.

Figure 3D:
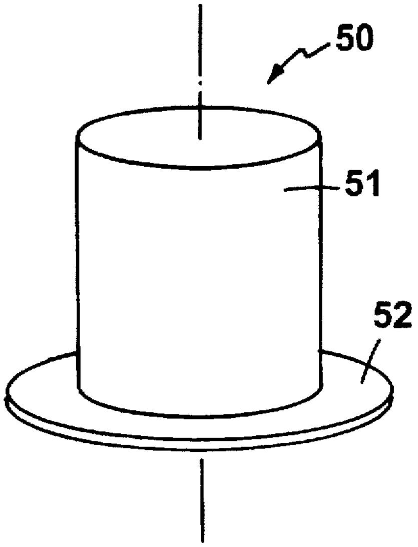

With reference now to FIG. 3D, in yet another embodiment, a solid consumable mandrel 50 containing upper 51 and lower 52 portions can be used during coil processing without a permanent mandrel core. In this embodiment, tape containing a superconducting material or its precursor is wound onto the upper portion 51 of the mandrel 50 to form the coil. During processing, the entire mandrel is oxidized or decomposed, allowing for easy removal. In the case of smaller coils, mandrels consisting essentially of consumable materials are particularly preferred as they simplify the mandrel-removal process.

During processing, tapes containing superconducting materials (or precursors to superconducting materials) are wound around the consumable component of the mandrel to form the coil. The superconducting material, or precursor thereto, may be present in a conventional insulated tape or, alternatively, in a composite conductor (i.e., a mono or multi-filament ceramic material surrounding by a metal matrix-forming material). Any type of superconducting material can be used with the consumable mandrel. In preferred embodiments, the superconducting material is a high-temperature superconducting material, preferably selected from the oxide superconducting family. In especially preferred embodiments, the high temperature superconducting material is selected from the BSCCO or YBCO family. An insulating material is used to electrically isolate single or multiple conductors. Details concerning the insulating and conducting components of the coil are described in, for example, Manlief et al., "Superconducting Wind-and-React Coils and Methods of Manufacture", U.S. Ser. No. 08/188220, U.S. Patent pending, the contents of which have been previously incorporated herein by reference.

The consumable mandrel may be used to form any type of superconducting coil, such as solenoid coils, layer-wound solenoid coils, pancake coils, and double pancake coils. These and other coil types are described in Manlief et al., "Superconducting Wind-and-React Coils and Methods of Manufacture", U.S. Ser. No. 08/188220, U.S. Patent pending, the contents of which have been previously incorporated herein by reference. In all embodiments, prior to heat treatment, the consumable component of the mandrel must be able to support the superconducting material or its precursor, which are typically wound using high (i.e., 1–5 lbs.) tensional loads, without undergoing deformation.

Once wound, the coil or precursor thereto is subjected to a final heat treating step in order to oxidize or otherwise decompose the consumable component of the mandrel. As described above, the wind-and-react method is preferably used to process the consumable mandrel, and oxidation or decomposition preferably occurs during the normal heat treating process without the use of additional steps. The processing method used for BSCCO materials is described in detail in Manlief et al., "Superconducting Wind-and-React Coils and Methods of Manufacture", U.S. Ser. No. 08/188220, U.S. Patent pending, the contents of which have been previously incorporated by reference. In general, for BSCCO materials, heat treating involves heating the superconducting material at a well-defined rate in an oxygen-containing environment to a temperature above 800° C.

Similarly, heat treating and processing methods for YBCO materials are described in "Strongly-Linked Oxide Superconductor and a Method of Its Manufacture", U.S. Ser. No. 07/881,675, U.S. Patent pending, the contents of which are incorporated herein by reference. In general, for these materials, the superconductor precursor is processed in an oxygen-containing environment at a temperature in the range of 750° C. to 800° C. for a time period sufficient to allow conversion to the superconducting state.

In a particular embodiment, for BSCCO materials, the heat treating steps include heating the coil at a rate of about 1°–10° C./min. to a temperature between 400° C. and 815° C.; heating the coil at a rate of about 1°–10° C./min. until a maximum temperature between 815° C. and 835° C. is obtained; heating the coil at the maximum temperature for a time period of between 0.1 and 100 hours; cooling the coil at a rate of about 1°–10° C./min. until a temperature between 795° C. and 815° C. is obtained; holding the coil at this temperature for a time period in the range of 1 to 300 hours; cooling the coil at a rate of about 1°–10° C./min. until a temperature between 735° C. and 795° C. is obtained; holding the coil at this temperature for a time period in the range of 1 to 100hours; cooling the coil at a rate of about 1°–10° C./min. until a temperature of about 20° C. is obtained. The heat treating steps are performed in an atmosphere which includes gaseous oxygen, with the oxygen pressure depending on both the material used as the consumable mandrel and the superconducting material to be processed. Typically, a pressure of about $1 \times 10^{-5}$ to 300 atm is used, with a preferred oxygen pressure being about 0.075 atm. Preferably, the heat treating step is performed in a furnace wherein the coil is situated so as to be maximally exposed to the oxidizing environment. In one embodiment, the coil may be placed on a honeycomb mantle composed of a heat and oxygen-resistant material to ensure adequate oxygen access.

In another embodiment, for YBCO materials, the coil is heated from room temperature at a rate of between 1°–10° C./min. to a temperature of between 300° C. and 600° C., where it is heated for between 400 to 800 hours. The temperature is then raised at a rate of between 1°–10° C./min. to a temperature of between 750° C. and 860° C., where it is heated for about 175 hours to yield a superconducting coil.

The wind-and-react heat treating parameters described above may be changed slightly to accommodate mandrels having different sizes and thermal properties. For example, if the mandrel has a high heat capacity and large size, the cooling rates of the heat treating steps may have to be increased in order for the coil to thermally equilibrate at low temperatures in the required amount of time. Similarly, the amount of heat transferred from the permanent mandrel core and the consumable component to the conductor will depend on the size of these components, with larger components dissipating more heat to the surrounding conductor than smaller components, thus requiring reduction of the heating temperatures and time durations of the various steps.

The consumable mandrel may also be used with the react-and-wind processing method. Here, precursor-containing tape is treated with general heat treating parameters used for processing the precursors to superconducting materials. The coil is then wound, and treated with a final step resulting in reaction of the consumable component of the mandrel. For the BSCCO family of superconductors, a particular react-and-wind processing method is described in detail in Riley et al, "Improved Processing for Oxide Superconductors", U.S. Ser. No. 08/041822, U.S. Patent Pending, the contents of which have been previously incorporated herein by reference.

During the react-and-wind process, the heat treating steps are chosen primarily to oxidize or decompose the consumable component of the mandrel. The steps include heating the consumable material in an atmosphere which consists primarily of gaseous oxygen, with the oxygen pressure and temperature depending on the material used as the consumable component.

The following Examples are used to further describe the method of the present invention.

EXAMPLE 1

Use of Tantalum as a Consumable Material

A precursor tape was insulated by wrapping quartz cloth around a precursor to $Bi_2Sr_2Ca_2Cu_3O_{10}$ (BSCCO (2223)) superconductor having a cross-sectional area of 10.3×99 mils. A 100-cm length of the insulated tape was then wound around a first cylindrical rod having a diameter of about 0.3 inches to form a precursor to a first pancake coil. A precursor to a second pancake coil was formed by first wrapping nine layers of tantalum mesh having a thickness of 4.5 mils around a second cylindrical rod having a diameter of 0.375 inches. A similar section of insulated precursor tape was then wound directly onto the mesh to form the coil precursor. The first and second precursor coils were wound with the same tensional loads, although the presence of the mesh gave the second precursor coil a slightly larger diameter than the first precursor coil. The first and second coils had outer diameters of, respectively, 0.814 and 0.849 inches. Each coil had approximately 17 windings of tape. Cylindrical rods were removed from both coils prior to processing with a final heat treatment step.

Both coils were then processed in an oxidizing environment with a heating/cooling schedule to generate the superconducting state. In particular, the coils were first heated from room temperature at a rate of between about 1°–10° C./min. until a temperature of 400° C. was obtained. The coils were heated at this temperature for 10 hours, and then heated at a rate of between about 1°–5° C./min. until a maximum temperature of 830° C. was reached. The coils were heated at this temperature of 40 hours. The coils were then cooled at a rate of between about 1°–5° C./min. until a temperature of 811° C. was obtained. The coils were then kept at this temperature for a time period of 40 hours, and then cooled at a rate of between about 1°–5° C./min. to a temperature of 787° C., where they were kept for a time period of 40 hours. Finally, the coils were cooled at a rate of between about 1°–5° C./min. until a temperature of about 20° C. was reached. The heat treating steps were performed in an atmosphere consisting of 7.5% oxygen.

During the heat treatment, the tantalum mesh of the second coil is reduced to a powder-like form which allows it to be easily removed from the inner portion of the second pancake coil. Removal of the mandrel appeared to have no effect on the physical structure of the coil.

The electrical properties of the two pancake coils were then measured at 77° K in self field. All measurements were performed by attaching to the coils two voltage taps separated by 1 cm, and then measuring current and voltage while the potential difference between the taps was less than 1 μV. The electrical properties for the two coils are summarized in Table 2, below:

TABLE 2

Electrical Properties for BSCCO Coils

| Coil Type | Critical Current $I_c$ (A) | Current Density $J_e$ (A/cm²) |
|---|---|---|
| First Pancake (no consumable component) | 21.63 | 3300 |
| Second Pancake (consumable component) | 26.20 | 4000 |

As is clear from the data, the second pancake coil processed using the consumable mandrel exhibited relatively higher critical current and engineering critical current density ($J_e$) when compared to the coil formed without a mandrel.

EXAMPLE 2

Use of Molybdenum as a Consumable Material

A precursor to a YBCO superconductor may be processed with a mandrel containing a consumable component made from molybdenum. In this embodiment, the superconductor precursor may be prepared using the procedure described in U.S. Pat. No. 5,034,373, the contents of which are incorporated herein by reference. In this case, a Y—Ba—Cu—Ag or Y(Ca)—Ba—Cu—Ag alloy may be packed as a powder into silver tube under inert conditions. Preferably, the alloy has the appropriate stoichiometry of metallic constituents to form a 124-type oxide superconductor. Silver powder, typically comprising 10–50wt% of the total powder, is included with the alloy. The silver tube can vary in dimension depending upon the desired size of the final tape, and typically has outer and inner diameters of, respectively, 1.57 cm and 1.25 cm, and a length of 14 cm. Normally, the packed silver tube is welded shut under a protective atmosphere, and then extruded to a tape using warm hydrostatic extrusion at 325° C. Multifilament tapes may be prepared by extruding a hexagonally shaped tape, cutting the extruded tape into shorter lengths, restacking these pieces into a billet in a hexagonal close-packed manner, and then co-extruding the billet. The resulting multifilament tapes may be stacked and further co-extruded to obtain tapes containing the desired number of oxide superconductor filaments. Multifilament tapes typically have 130–18,000 oxide superconductor filaments per tape, and an overall diameter of between about 0.090 to 0.240 cm. Tapes typically have overall dimensions of about 0.025 cm×0.25 cm to 0.050 cm×0.50 cm. Before winding, the tape is oxidized for more than 400 hours. Deformation texturing of the tape may also be done.

Once fabricated, the tape containing the superconductor precursor may be wound onto a mandrel as a pancake coil. A molybdenum foil is used to separate the tape from the permanent portion of the mandrel. The coil is then annealed at 850° C. for 175 hours in 1 atmosphere of oxygen to form the $YBa_2Cu_4O_8$ oxide superconductor. Under these conditions, the molybdenum foil will be completely oxidized and reduced to a powder-like form, thereby allowing the processed coil to be easily removed from the mandrel. Using the electrical testing procedures described in Example 1, a tape segment from a typical pancake coil processed with this method is expected to have the electrical properties shown in Table 3, below.

TABLE 3

Estimated Electrical Properties for a YBCO coil

| Coil Type | $I_c$ (A) | $J_c$ (A/cm²) | $J_c$ (A/cm² at 0.1 Tesla) |
|---|---|---|---|
| Pancake Coil | 21 | 5420 | 620 |

Typically, using the above processing method, a multiphase mixture of $YBa_2Cu_4O_8$ and other oxides (that is, $YBa_2Cu_3O_x$, where x is between 5 and 10) will result. Experiments run with annealing temperatures ranging from 790° C. to 860° C. in 10° increments have indicated that temperatures below 810° C. and, preferably below 800° C., are needed to obtain phase-pure $YBa_2Cu_4O_8$. Most of the data in the literature indicates that processing at temperatures below 860° C. under oxygen at ambient pressure would yield phase-pure $YBa_2Cu_4O_8$. Under these processing conditions, the molybdenum foil will again be completely oxidized and reduced to a powder-like form.

Other embodiments are within the scope of the following claims.

What is claimed is:

1. A method for producing a superconducting magnetic coil comprising the steps of:

fabricating a length of tape comprising one of a superconducting material and a precursor to a superconducting material, winding said length of tape around a mandrel comprising at least in part a consumable component to form a coil, heat treating said coil after said winding step by exposing said coil to high temperatures in an environment comprising oxygen, said heat treating step resulting in the mechanical weakening of portions of said consumable component of said mandrel, and removing said mandrel from said coil without significantly affecting the electro-mechanical properties of said coil.

2. The method of claim 1, wherein said heat treating step comprises the steps of:

heating and cooling said coil in an environment comprising oxygen, said heat treating step resulting in oxidation of portions of said consumable component of said mandrel.

3. The method of claim 2, wherein said heat treating step further comprises the steps of:

heating said coil in an oxidizing environment wherein the pressure of said oxygen is between $1\times10^{-5}$ and 300 atm., heating said coil from room temperature until a temperature of between 700° C. and 900° C. is obtained, heating said coil at said temperature of between 700° C. and 900° C. for a time period sufficient to allow oxidation of said portions of said consumable component of said mandrel, and cooling said coil to room temperature.

4. The method of claim 3, wherein said tape comprises the precursor to a superconducting material.

5. The method of claim 4, wherein said heat treating step further comprises converting said precursor to a superconducting material to a superconducting material.

6. The method of claim 5, wherein said step of heat treating comprises the steps of:

heating said coil at a rate of about 1°–10° C./min. until a temperature between 400° C. and 815° C. is obtained, heating said coil at a rate of about 1°–10° C./min. until a maximum temperature of between 815° C. and 835° C. is obtained, heating said coil at said maximum temperature of between 815° C. and 835° C. for a time period of between 0.1 and 100 hours, cooling said coil at a rate of about 1°–10° C./min. until a temperature of between 795° C. and 815° C. is obtained, holding said coil at said temperature of between 795° C. and 815° C. for a time period in the range of 1 to 300 hours, cooling said coil at a rate of about 1°–10° C./min. until a temperature of between 735° C. and 795° C. is obtained, holding said coil at said temperature of between 735° C. and 795° C. for a time period in the range of 1 to 100 hours, and cooling said coil at a rate of about 1°–10° C./min. until a temperature of about 20° C. is obtained, said heat treating step being performed in said environment comprising oxygen, wherein said oxygen has a pressure of between about $1\times10^{-5}$ and 300 atm.

7. The method of claim 1, wherein said step of heat treating comprises the steps of:

heating said coil at a rate of about 1°–10° C./min. until a temperature of between 300° C. and 600° C. is obtained, heating said coil at said temperature of between 300° C. and 600° C. for a time period of about 100 and 800 hours, heating said coil at a rate of about 1°–10° C./min. until a maximum temperature of between 700° C. and 900° C. is obtained, heating said coil at said maximum temperature of between 700° C. and 900° C. for a time period of 1 and 200 hours, and cooling said coil at a rate of about 1°–10° C./min. until a temperature of 20° C. is obtained, said heat treating step being performed in said environment comprising oxygen, wherein the pressure of said oxygen is between $1\times10^{-5}$ and 300 atm.

8. The method of claim 2, wherein said tape comprises a superconducting material.

9. The method of claim 8, wherein said heat treating step comprises the steps of heating said consumable component in an oxygen-containing environment to a temperature which allows at least partial oxidation of said consumable material.

10. The method of claim 1, wherein said heat treating step comprises the steps of:

heating said coil from room temperature until a temperature of between 300° C. and 900° C. is obtained, heating said coil at said temperature of between 300° C. and 900° C. for a time period sufficient to allow thermal decomposition of said portions of said consumable component of said mandrel, and cooling said coil to room temperature.

11. The method of claim 1, wherein said mandrel consists essentially of a consumable material.

12. The method of claim 11, wherein said mandrel is removed from said coil during said heat treating step.

13. A method for producing a superconducting magnetic coil comprising the steps of:

fabricating a length of tape comprising one of a superconducting material and a precursor to a superconducting material, winding said length of tape around a mandrel comprising at least in part a consumable component to form a coil, heating said coil from room temperature until a temperature between 700° C. and 900° C. is obtained, said heating step taking place in an oxidizing environment wherein the pressure of said oxygen is between $1\times10^{-5}$ and 300 atm., heating said coil at said temperature between 700° C. and 900° C. in said oxidizing environment for a time period sufficient to allow oxidation of at least some of said portions of said consumable component of said mandrel, said heating being sufficient to cause a weakening of said portions of said consumable component of said mandrel such that said mandrel may be removed from said coil without significantly affecting the electro-mechanical properties of said coil, and removing said mandrel from said coil.

14. The method of claim 13, wherein said winding step is used to form one of a layer-wound solenoid coil, a "pancake" coil, and a "double pancake" coil.

15. A superconducting magnetic coil produced by:

fabricating a length of tape comprising one of a superconducting material and a precursor to a superconducting material, winding said length of tape around a mandrel comprising at least in part a consumable component to form a coil, heat treating said coil after said winding step by exposing said coil to high temperatures in an environment comprising oxygen, said heat treating step resulting in the mechanical weakening of portions of said consumable component of said mandrel, and removing said mandrel from said coil without significantly affecting the electro-mechanical properties of said coil.

16. The superconducting magnetic coil of claim 15, wherein said consumable component of said mandrel is composed of a material which becomes oxidized when exposed to high temperatures and an oxidizing environment.

17. The superconducting magnetic coil of claim 16, wherein said consumable component is a metal.

18. The superconducting magnetic coil of claim 17, wherein said metal is selected from the group consisting of niobium, molybdenum, tungsten, vanadium, tantalum, hafnium, zirconium, yttrium, rare earth metals, iron, chromium, cobalt, nickel, copper, and titanium.

19. The superconducting magnetic coil of claim 15, wherein said consumable component of said mandrel is composed of a material which is thermally decomposed when exposed to high temperatures.

20. The superconducting magnetic coil of claim 19, wherein said consumable component is a cellulose-based material.

21. The superconducting magnetic coil of claim 15, wherein said consumable component of said mandrel is constructed so as to partially surround a core portion of said mandrel, said consumable component resulting in separation of said mandrel and an inner-most layer of said coil.

22. The superconducting magnetic coil of claim 21, wherein said consumable component is a metal foil or a metal mesh.

23. The superconducting magnetic coil of claim 21, wherein said consumable component is shaped as a sleeve adapted to partially surround said core portion of said mandrel.

24. The superconducting magnetic coil of claim 23, wherein said sleeve is wrapped around said mandrel.

25. The superconducting magnetic coil of claim 21, wherein said consumable component is comprised of a plurality of consumable portions.

26. The superconducting magnetic coil of claim 25, wherein each of said consumable portions is shaped as a strip adapted to cover part of said core portion of said mandrel.

27. The superconducting magnetic coil of claim 15, wherein said mandrel consists essentially of a consumable material.

28. The superconducting magnetic coil of claim 15, wherein said mandrel is one of substantially circular and substantially elliptical in cross-sectional shape.

29. The superconducting magnetic coil of claim 15, wherein said superconducting material is a high-temperature superconducting material.

30. The superconducting magnetic coil of claim 29, wherein said high-temperature superconducting material is selected from an oxide superconducting family.

* * * * *